(12) United States Patent
Krogstrup Jeppesen et al.

(10) Patent No.: US 10,879,464 B2
(45) Date of Patent: Dec. 29, 2020

(54) SEMICONDUCTOR AND FERROMAGNETIC INSULATOR HETEROSTRUCTURE

(71) Applicant: Microsoft Technology Licensing, LLC, Redmond, WA (US)

(72) Inventors: Peter Krogstrup Jeppesen, Copenhagen (DK); Yu Liu, Copenhagen (DK); Alessandra Luchini, Lund (SE)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/246,287

(22) Filed: Jan. 11, 2019

(65) Prior Publication Data

US 2020/0227636 A1 Jul. 16, 2020

(51) Int. Cl.
*H01L 49/00* (2006.01)
*H01L 29/06* (2006.01)
*H01L 39/00* (2006.01)
*H01L 43/10* (2006.01)
*H01L 29/20* (2006.01)

(52) U.S. Cl.
CPC ........ *H01L 49/003* (2013.01); *H01L 29/0669* (2013.01); *H01L 29/20* (2013.01); *H01L 39/005* (2013.01); *H01L 43/10* (2013.01)

(58) Field of Classification Search
CPC . H01L 49/003; H01L 39/005; H01L 29/0669; H01L 29/20
See application file for complete search history.

(56) References Cited

U.S. PATENT DOCUMENTS 6,183,564 B1  2/2001  Reynolds et al.
2017/0141287 A1*  5/2017  Barkeshli .............. H01L 39/223

OTHER PUBLICATIONS

Ouassou et al., Electric control of superconducting transition through a spin-orbit coupled interface, Scientific Reports 6:29312, Jul. 18, 2016 (Year: 2016).*
Hao et al., Thin-Film Superconductor in an Exchange Field, Physical Review Letters, vol. 67, No. 10, 1991, pp. 1342-1345 (Year: 1991).*

(Continued)

*Primary Examiner* — Cuong Q Nguyen
*Assistant Examiner* — Shih Tsun A Chou
(74) *Attorney, Agent, or Firm* — Klarquist Sparkman, LLP

(57) ABSTRACT

A first aspect provides a topological quantum computing device comprising a network of semiconductor-superconductor nanowires, each nanowire comprising a length of semiconductor formed over a substrate and a coating of superconductor formed over at least part of the semiconductor; wherein at least some of the nanowires further comprise a coating of ferromagnetic insulator disposed over at least part of the semiconductor. A second aspect provides a method of fabricating a quantum or spintronic device comprising a heterostructure of semiconductor and ferromagnetic insulator, by: forming a portion of the semiconductor over a substrate in a first vacuum chamber, and growing a coating of the ferromagnetic insulator on the semiconductor by epitaxy in a second vacuum chamber connected to the first vacuum chamber by a vacuum tunnel, wherein the semiconductor comprises InAs and the ferromagnetic insulator comprises EuS.

9 Claims, 8 Drawing Sheets

(56) References Cited

OTHER PUBLICATIONS

Kato et al., Microscopic theory of spin transport at the interface between a superconductor and a ferromagnetic insulator, Physical Review B 99, 144411 (2019) (Year: 2019).*

Jiang et al., "Structural and proximity-induced ferromagnetic properties of topological insulator-magnetic insulator heterostructures," *American Institute of Physics Advances*, vol. 6, Issue 5, pp. 1-7 (Feb. 2016).

Kallaher, "Electron Tunneling Transport Across Hetereojunctions Between Europium Sulfide and Indium Arsenide," Ph.D. Thesis, Florida State University, jpp. 1-128 (2007).

Katmis et al., "A high-temperature ferromagnetic topological insulating phase by proximity coupling," *Nature*, vol. 533, pp. 1-4 (May 2016).

Sau et al., "A generic new platform for topological quantum computation using semiconductor heterostructures," *Physical Review Letters*, vol. 104, pp. 1-4 (Jan. 2010).

Swartz et al., "Integration of the Ferromagnetic Insulator EuO onto Graphene," *ACS Nano*, vol. 6, Issue 11, pp. 1-18 (Oct. 2012).

Wei et al., "Strong interfacial exchange field in the graphene/EuS heterostructure," *Nature Materials*, vol. 15, Issue 7, pp. 711-716 (Jul. 2016).

* cited by examiner

SEMICONDUCTOR AND FERROMAGNETIC INSULATOR HETEROSTRUCTURE

TECHNICAL FIELD

The disclosure relates to a heterostructure formed from a combination of semiconductor and ferromagnetic insulator materials, for use in forming quantum or spintronic devices which exploit the quantum effect of lifting spin degeneracy.

BACKGROUND

In quantum computing and other quantum electronic applications, anything that can reduce area, give lower power consumption or increase processing speed is of interest. Spintronic and topological quantum computing are two examples of fields that have the potential to address at least some of these points.

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

Spintronics is another field of electronic devices. The term is a contraction of "spin transport electronics". It refers to a class of electronic devices which exploit not only the charge of the electrons in a solid state material, but also their spin. It relies on inducing and manipulating a population of spin polarized electrons as a means of storing or conveying data. This phenomenon can be exploited for a number of applications, such as to provide data storage media, sensing elements, or spintronic transistors for use in computing or other electronic applications.

Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect.

Lifting the electron spin degeneracies in solid state materials plays a key role in semiconductor spintronics and is believed to be on the critical path for the development of quantum computation, communication and sensing. In topological quantum computing as well, a requirement for obtaining topologically protected states is to lift the spin degeneracy.

SUMMARY

An issue with existing topological quantum computing is that the need to apply an external magnetic field is inconvenient. The magnetic field is required in order to lift the spin degeneracy in the semiconductor of the nanowire, which is one of the conditions required to induce an MZM in a nanowire. However one obstacle to implementing practical quantum computing devices is the need for an external electromagnet.

One way to lift the spin degeneracy of the electrons in a semiconductor in general is to form a heterostructure from a portion of the semiconductor and a ferromagnetic insulator. The exchange field between the semiconductor and the ferromagnetic insulator cause the split in the energy levels of the electrons in the semiconductor. This may also require cooling of the heterostructure to below a certain temperature, known as the Curie temperature.

Such a heterostructure has been proposed for use in a spintronic device, but has not previously been proposed as suitable for use in topological device. The inventors of the present disclosure have discovered that the inherent magnetic field generated by a ferromagnetic insulator when formed over a semiconductor is sufficient to induce MZMs in the semiconductor (when accompanied by the other known conditions for inducing MZMs).

Hence according to a first aspect disclosed herein, there is provided a topological quantum computing device comprising a network of semiconductor-superconductor nanowires, each nanowire comprising a length of semiconductor formed over a substrate and a coating of superconductor formed over at least part of the semiconductor; wherein at least some of these nanowires further comprise a coating of ferromagnetic insulator disposed over at least part of the semiconductor. In embodiments, some or all of the ferromagnetic insulator is formed directly on some or all of the semiconductor. In embodiments, some or all of the coating of ferromagnetic insulator is disposed between the semiconductor and the superconductor, at least some of the superconductor being formed directly on at least part of the ferromagnetic insulator.

The ferromagnetic insulator can be formed on the semiconductor by means of epitaxy. Epitaxy is a known deposition technique that comprises growing one crystalline material on another crystalline material, in this case the semiconductor and the ferromagnetic insulator. The first material acts as a seed crystal for the second material being grown on the first. The growth is performed selectively, such as by forming a patterned mask over a layer of the first material (e.g. semiconductor) and growing the deposited material (e.g. ferromagnetic insulator) in the regions left exposed by the masked. In this case the process can also be referred to as selective area growth (SAG). Example techniques for the epitaxial deposition itself include, for example, electron-beam physical vapour deposition, plasma-enhanced chemical vapour deposition, or atomic layer deposition, and molecular beam epitaxy.

Most existing combinations of semiconductor and ferromagnetic insulator that are known to be suitable for lifting spin degeneracy are not always well lattice matched. That is to say, the spatially-periodic crystal lattice of the ferromagnetic insulator has a substantially different lattice constants than that of the semiconductor, which will bring additional difficulties to fabrication of the heterostructure and thus development of the relevant devices.

One existing thesis has proposed a combination of the ferromagnetic insulator EuS (Europium Sulphide) with the semiconductor InAs (Indium Arsenide) for use lifting the spin degeneracy in the InAs, for the purpose of fabricating a spin transistor. The crystal structures of EuS and InAs have the same cubic symmetry and substantially similar lattice constants. This advantageously means there are no dislocations (i.e. irregularities) in the crystal heterostructure at the interface between the semiconductor and the ferromagnetic insulator.

However, the techniques used at the time would have led to an interface between the InAs and EuS that was rough and oxidized. Techniques at the time involved etching to expose the InAs surface, followed by ex-situ deposition of the EuS.

According to a second aspect disclosed herein, there is provided a method of fabricating a quantum or spintronic device, the device comprising a wafer including a heterostructure of semiconductor and ferromagnetic insulator. The method comprises forming the heterostructure by: i) forming portions of semiconductor directly or indirectly over a substrate in a first vacuum chamber, the semiconductor comprising InAs (with or without doping); and ii) growing a coating of ferromagnetic insulator on at least part of the InAs by epitaxy in a second vacuum chamber connected to the first by a vacuum tunnel, the ferromagnetic insulator comprising EuS (with or without doping). The method comprises moving the wafer from the first chamber to the second chamber via the vacuum tunnel without breaking vacuum between forming the semiconductor and the ferromagnetic insulator.

By depositing the EuS in a chamber connecting with the first chamber via a channel of vacuum, this avoids the surface of the InAs exposing to the air and thus avoids oxidization when the sample is transferred. Preferably the deposition of the InAS is also by epitaxial growth, e.g. molecular beam epitaxy. By depositing EuS on the surface of InAs after InAs growth, the InAs growth will bring the atomic flatness on the InAs surface and avoid roughness.

Optionally, in some embodiments the method may further comprising forming a protective oxide layer and/or coating of superconductor (e.g. Al) directly or indirectly over at least part of the heterostructure. The superconductor may be formed by epitaxy or another deposition method.

In some cases there is a possibility that a layer of In—S forms at an interface where the semiconductor InAs meets the ferromagnetic insulator EuS. However, in most cases however the InAs forms a direct interface with the EuS without an intermediate layer of In—S in between. Either variant of the heterostructure can be used to provide any of the advantages disclosed herein including the coherent lattice matching.

According to another instantiation of the second aspect disclosed herein, there is provided a device formed from any of said methods.

According to a further instantiation of the first or second aspect, there is provided a method of operating the device. The method may comprise cooling the device to the Curie temperature or less. For the disclosed heterostructure of InAs and EuS, the inventors have found that the Curie temperature is 16° K. The inventors have found is the optimal temperature range to cause lifting of the spin degeneracy for the disclosed combination of materials, in particular embodiments the device may be cooled to 2° K. However it is not excluded that the lifting of the degeneracy could also be achieved at higher temperatures. In the case of a topological device, the method may also comprise cooling to a temperature sufficient to induce superconductivity in at least part of the nanowire. The method may further comprise gating part of the nanowire with an electrostatic potential.

The first and second aspects may be used independently or in combination. Hence in embodiments, the semiconductor of the nanowire core may optionally be InAs and the ferromagnetic insulator formed over at least part of the nanowire core may optionally be EuS. Alternatively other semiconductors such as GaSb or InSb; and/or other ferromagnetic insulators such as EuO, Y3Fe5O12/Bi3Fe5O12, YFeO3, Fe2O3, Fe3O4, GdN, Sr2CrReO6, CrBr3/CrI3, YTiO3 or diluted magnetic semiconductors may be used, or combinations thereof. The semiconductor and ferromagnetic insulator may be formed in first and second vacuum chambers and transferred via a vacuum tunnel, or other known arrangements of fabrication equipment may be used. Note also that the recitation of any of these materials does not exclude the optional possibility of doping.

The superconductor may optionally be Al (aluminium). Al has also been found to be well lattice matched to EuS, making InAs—EuS—Al a particularly suitable combination for forming nanowires for use in topological quantum computing. However the combination of EuS and InAs can also be used without the Al; coating in other applications such as spintronics. Also, other combinations of semiconductor, ferromagnetic insulator and superconductor could be used to form nanowires with inherent lifting of spin degeneracy). This can enable the topological regime to be induced in a nanowire without the need for an external magnetic field, or at least a reduced external magnetic field than would have been needed otherwise.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

The present disclosure relates to techniques and structures for forming quantum electronic devices and spintronic devices. E.g. the types of devices to which the disclosed techniques may apply include qubits, nanowires, spintronic devices or quantum sensing device. Particularly, the present disclosure is concerned with devices that exploit the effects of lifting spin degeneracy.

Figure 1:
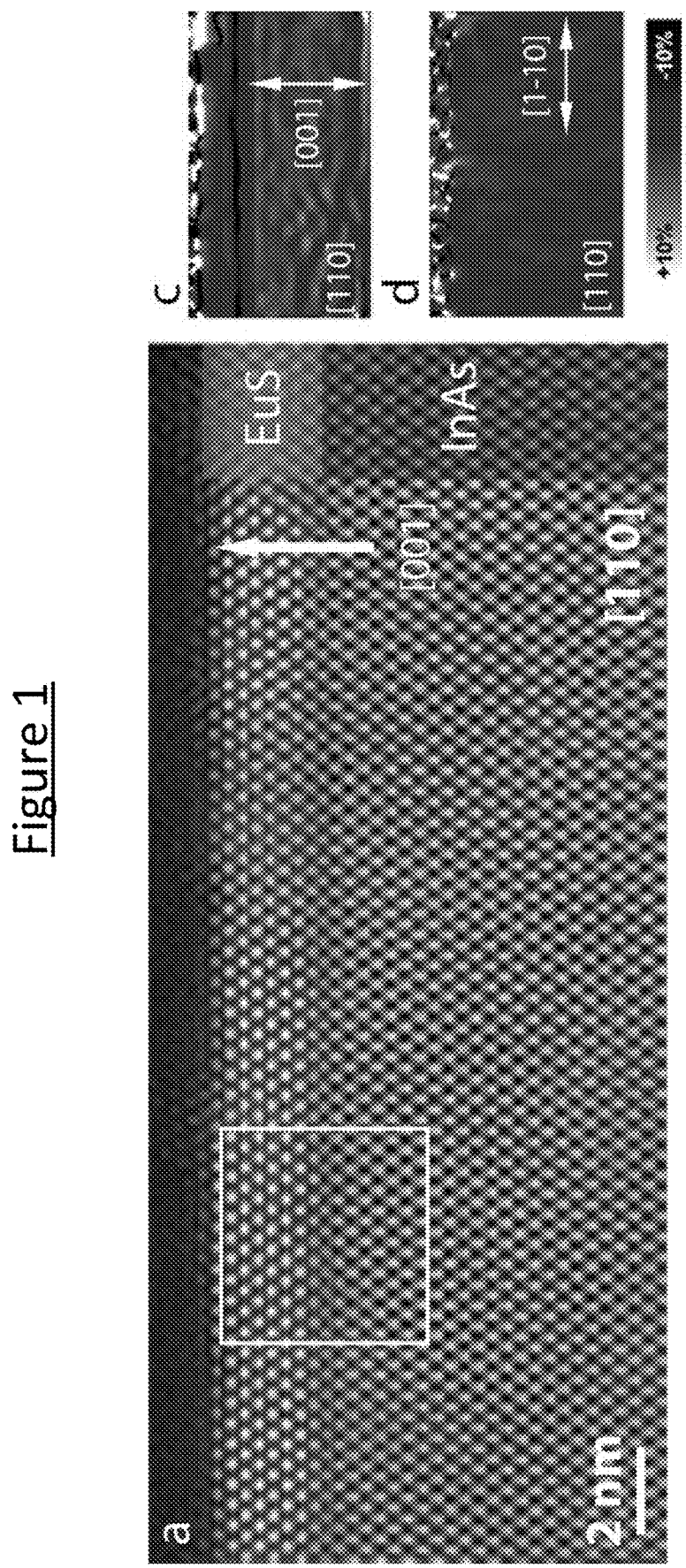
FIG. 1 illustrates coherent cubic on cubic epitaxy of EuS on InAs.
Figure 1:
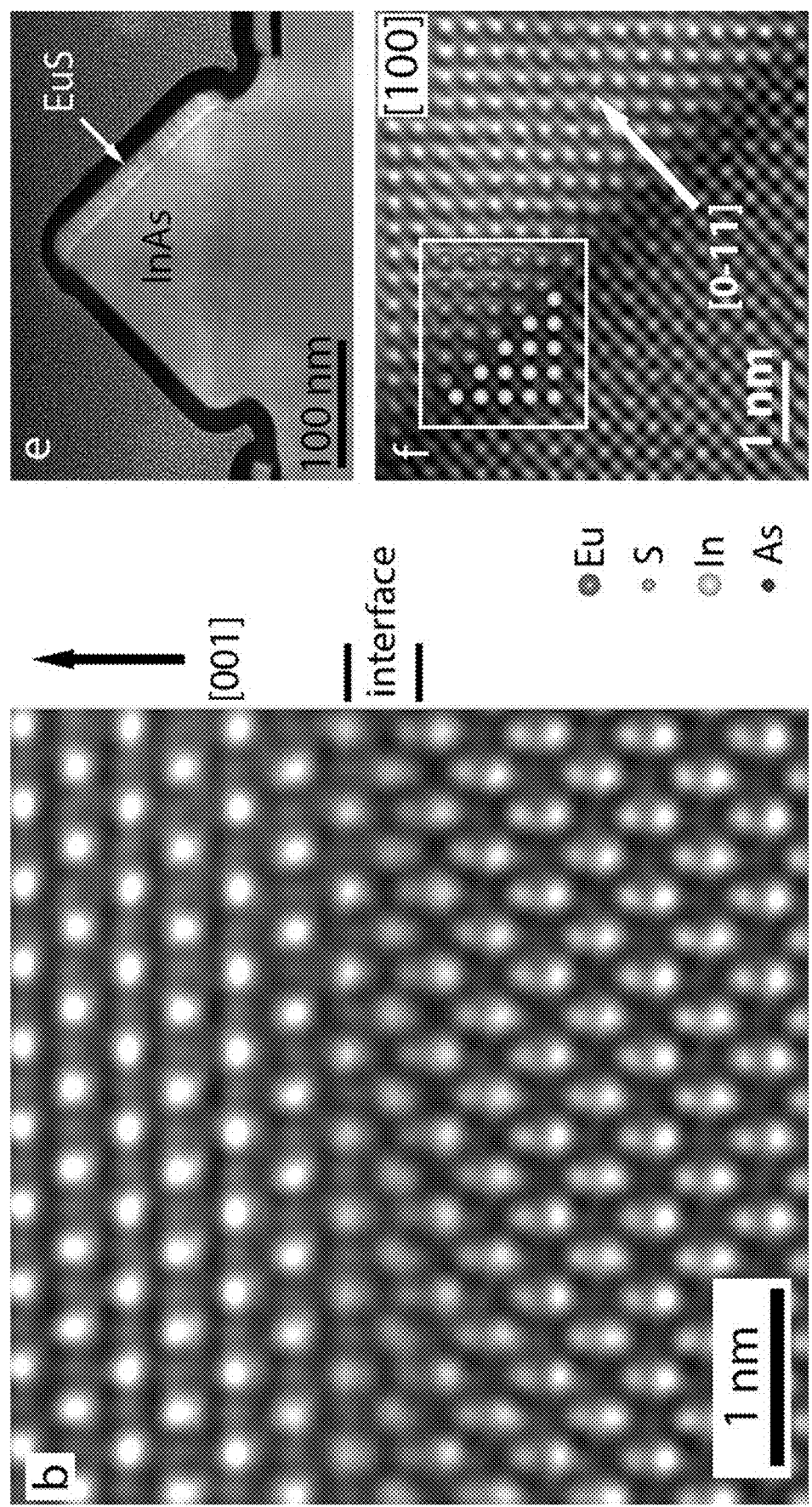

The present disclosure provides a heterostructure comprising a semiconductor proximity-coupled to a ferromagnetic insulator by means of epitaxy. According to one aspect of the disclosure, this hybrid material exhibits coherent, dislocation-free epitaxial matching of the semiconductor InAs and ferromagnetic insulator EuS. This is shown in FIG. 1 (discussed in more detail later). Further, the InAs acquires a magnetic splitting induced by proximity to EuS. See FIG. 2 (also discussed in more detail later). This can be exploited to provide any one or more of a number of desirable properties in quantum electronic applications such as spintronics and topological quantum computing.

Figure 3A:
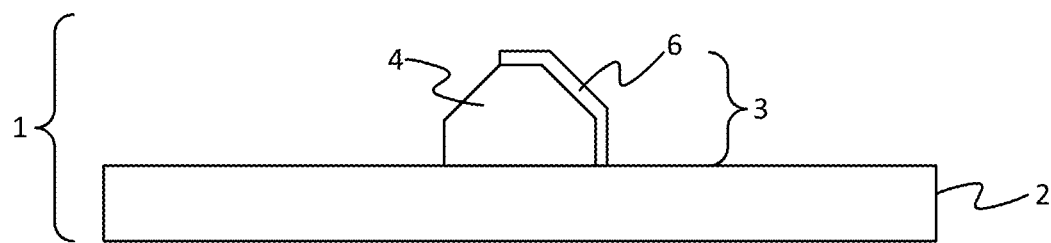
FIGS. 3a to 3d schematically illustrate some example heterostructures.

FIG. 3a illustrates an example device (or part thereof) comprising a heterostructure formed in accordance with embodiments disclosed herein. The device comprises a wafer 1 comprising a substrate 2 and multiple layers formed over the substrate 2. The multiple layers comprise at least a first layer comprising structured portions of semiconductor 4, and a second layer comprising a coating ferromagnetic insulator 6 formed on at least part of some or all of the portions of semiconductor 4. Each such portion of semiconductor 4 and its respective coating of ferromagnetic insulator 6 thus forms a respective heterostructure 3. One such heterostructure 3 is shown for illustrative purposes, but it will be appreciated that, depending on the device being fabricated, there may be more present.

The portions of semiconductor 4 are formed over the substrate 2 by any suitable known deposition technique. The substrate 2 herein refers to the ultimate base of the wafer, and the "wafer" refers to the base plus any additional layers formed on or over the substrate at any point in the fabrication or in the final finished wafer. "Over" herein may mean either formed directly on, or indirectly over with any one or more intermediate layers in between. So "over" the substrate herein may mean either formed directly on the substrate 2, or with one or more intervening layers such as a dielectric layer between the substrate 2 and the semiconductor 4. The coating of ferromagnetic insulator 6 is grown at least partially on each of some or all of the semiconductor portions 4 by means of epitaxy. "On" herein means directly on, i.e. in contact with, without any intermediate layer. Note also that the terms "on" or "over" or such like, as used herein, do not necessarily imply a particular orientation relative to gravity. Rather, they refer to the position relative to the substrate 2.

Figure 3B:
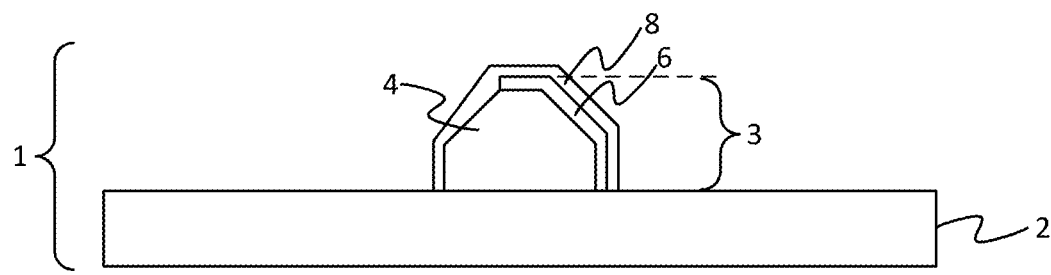

Optionally one or more further layers may be formed over the heterostructures 3. FIG. 3b illustrates one example whereby an oxide layer 8 is formed over part or all of each heterostructure 3 (or at least some of the heterostructures). The oxide layers can be used to protect heterostructures against $O_2$ or $H_2O$ in air. They may be used to protect samples in TEM (transmission electron microscopy) or for the reflective layer in PNR (polarized neutron reflectivity). The oxide layer 8 could be for example silicon oxide, SiOx; or more generally any dielectric or other insulating material could be used in its place. Note however that the oxide layer 8 is optional, and in other cases this protection may not be required, or could be provided by other upper layers of the wafer or IC package (not shown). In some cases the oxide layer 8 may be used only in samples during experimentation stages, or as an intermediate step in the fabrication, but may not remain in the final product.

Figure 3C:
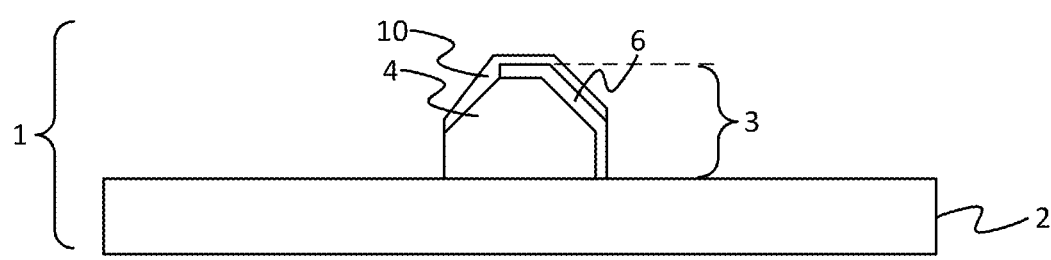

FIG. 3c illustrates an example where a coating of superconductor material 10 is formed over part or all of each heterostructure 3 (or at least some of the heterostructures 3). At least some of the superconductor 10 is preferably formed on at least part of the ferromagnetic insulator 6 of each such heterostructure 3. In embodiments, at least some of the heterostructures 3 each comprise a length or line of the semiconductor material 4, with the ferromagnetic coating 6 covering part or all of the perimeter of the line (i.e. the edge in the plane perpendicular to the line) line along some or all of the length of the line (i.e. in the direction parallel to the length of the line). In this case FIG. 3c represents a cross section in the plane perpendicular to the line. The superconductor 10 is then formed over each such heterostructure 3, covering part or all of the perimeter of the line along some or all of the length of the line, preferably formed at least partially on the ferromagnetic insulator 6, and/or in embodiments formed partially on the semiconductor 4. Each such heterostructure 3 and its respective superconductor coating 10 thus forms a respective semiconductor-superconductor nanowire. A network of such nanowires may be formed over the substrate 2 can be arranged to form a topological quantum computing device comprising one or more topological qubits. In operation, Majorana zero modes (MZMs) and hence the topological regime may be induced in parts of some or all of the nanowires by means of a magnetic field and cooling to a temperature at which the superconductor 10 exhibits superconducting behaviour. In embodiments the inducement of the MZMs and topological regime may further comprise gating with an electromagnetic potential. Structures for forming qubits and the inducement of MZMs and the topological regime in a semiconductor-superconductor nanowire are, in them themselves, known in the art.

According to embodiments disclosed herein however, the magnetic field need not be an external magnetic field (or at least not entirely an external magnetic field). Instead, this can be replaced or supplemented by the inherent magnetic properties of the ferromagnetic insulator 6 in the heterostructure 3.

Figure 3D:
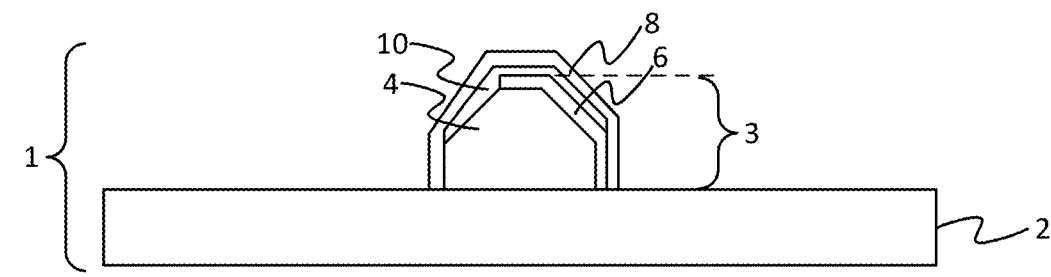

FIG. 3d illustrates an example with both the superconductor layer 10 and the oxide layer 8. The superconductor 10 may be formed on or over the semiconductor 4 and/or ferromagnetic insulator 6 of the heterostructure 3 of the nanowire, around some or all of the perimeter of the heterostructure 3 along some or all of its length. The oxide 8 may be formed on or over some or all of the superconductor 10, around some or all of the perimeter of the nanowire along some or all of its length.

In further examples, there could be other alternative or additional layers formed over the heterostructures, such as conductive vias between the heterostructures, and/or between the heterostructures and one or more other components. As another example, an upper protective layer of plastic or wax may be formed over the whole structure.

Note that the FIGS. 3a to 3d are schematic and the shapes and dimensions shown therein are not intended to be limiting.

In all the examples, the ferromagnetic insulator 6 is formed on the semiconductor 4 by means of epitaxy, or epitaxial growth, e.g. electron-beam physical vapour deposition, plasma-enhanced chemical vapour deposition, atomic layer deposition, or molecular beam epitaxy. Epitaxy refers to techniques whereby a second crystalline material is grown on a first crystal using the first as a seed; the molecules of the first, seed crystal acting as a basis for the formation of the crystal lattice structure of the second, deposited material. A selective area growth technique may be used to form the patterned structure. The growth mechanism may for example be vapour-liquid-solid (VLS).

One issue with existing heterostructures formed in this way is that dislocations are formed at the interface between the semiconductor 4 and the ferromagnetic insulator 8. The reason for this is that the two materials are not well lattice matched. I.e. they do not have well matched lattice structures with the same or similar lattice constants. This means the spatial period of the crystal lattice in one material is not well aligned with that of the other material, which puts a strain on the binding between them at points where they are most out of phase spatially. At some such points the epitaxial grown structure at the interface cannot take the strain and this causes irregularities in the join at the interface at these points. These are known as dislocations.

To address this, according to one aspect disclosed herein, the material used for the semiconductor 4 is Indium Arsenide (InAs), and the material used for the ferromagnetic 6 insulator is Europium Sulphide (EuS). Both these materials have the same crystal symmetries, namely a cubic symmetry. Further, they have a very similar lattice constant. This means that the spatial period of the crystal lattice structure of the EuS matches and aligns with the spatial period of the crystal lattice structure of the InAs, and hence they "fit" together well, avoiding dislocations (or at least making them much rarer).

Figure 4:
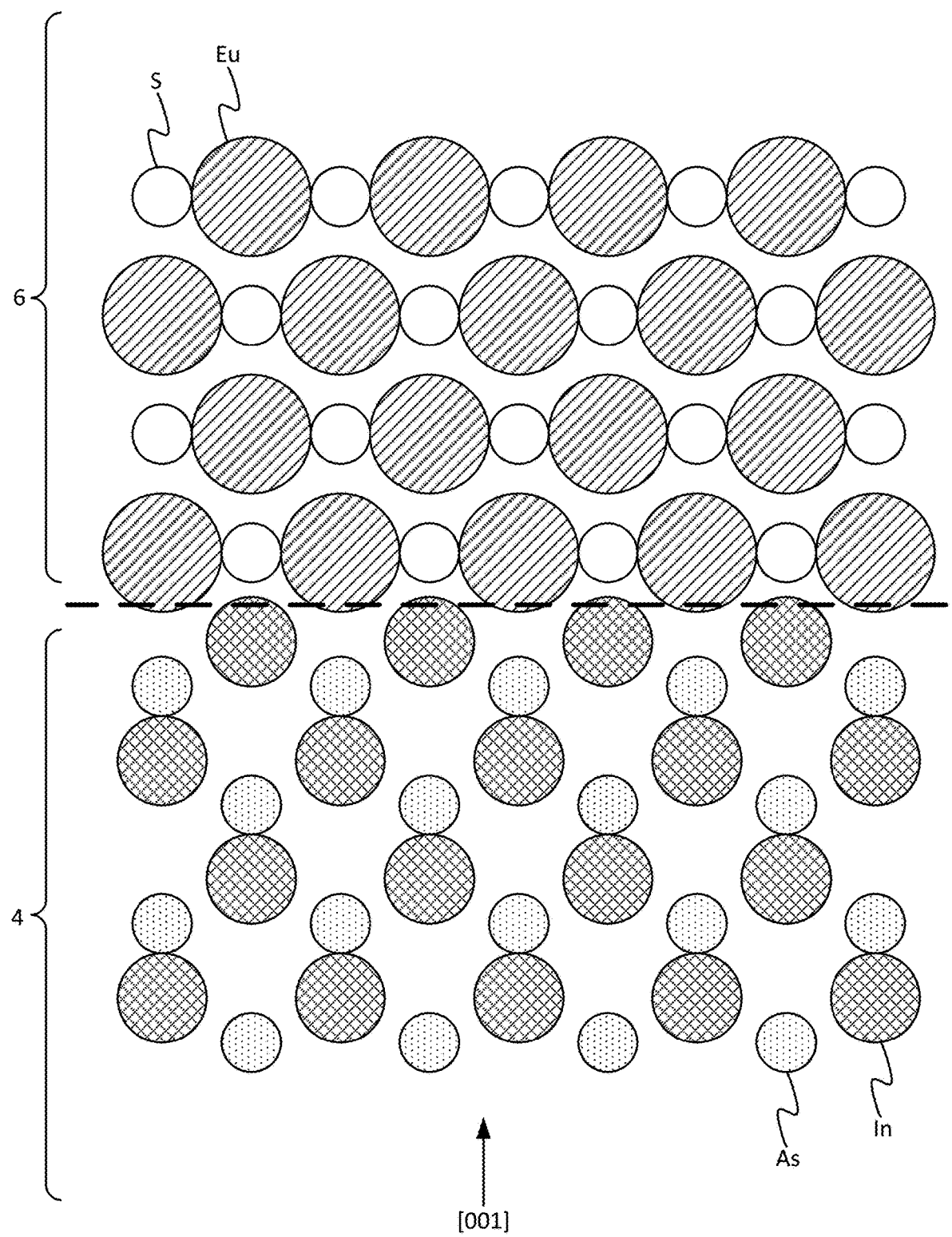
FIG. 4 schematically illustrates a lattice structure of EuS on InAs.

This is illustrated schematically in FIG. 4. Note that although FIG. 4 is schematic, the relative alignment and spatial period of the crystal lattice structure of the EuS relative to the InAs is intended to be an idealized representation of the actual physical relationship between the two when the one is grown on the other by epitaxial growth. The arrow at the bottom of FIG. 4 represents the plane (001) in the lattice structure of both materials. As is known to crystallographers, reciprocal space is a spatial frequency domain transform of a representation of a periodic crystal structure $R=n_1 a_1+n_2 a_2+n_3 a_3$ in the spatial domain (e.g. Cartesian space in this example), where $a_1$, $a_2$, $a_3$ are vectors each representing the direction of a recurring pattern of atoms or molecules, and $n_1$, $n_2$ $n_3$ are scalars representing the space between instances of the pattern along each respective direction. In reciprocal space the same lattice can be described by a set of vectors of the form (klm), the set being a spatial frequency domain transform (e.g. Fourier transform) of the spatial domain representation R. Each vector (klm) represents the normal to a recurring plane of atoms or molecules in the lattice structure, and the magnitude of the vector represents the relative spacing between instances of the plane. Note, while FIG. 4 shows alignment in the (001) plane, it is also possible to grow InAs/EuS in different orientations on different facets and still keep good epitaxial matching.

Note: in some cases, it is possible that a layer of In—S may form at the interface between the InAs and the EuS. This is illustrated schematically in FIG. 6, labelled by reference numeral 12. An InAs/EuS heterostructure that includes this layer can have at least all of the advantageous properties discussed previously, including the coherent lattice matching. Note that the In—S at the interface is not an InS compound. Rather, it should be seen as part of the interface.

In either scenario, one issue that may arise in forming a ferromagnetic insulator such as EuS on InAs is that the interface may be rough and oxidized if formed by prior techniques of etching to expose InAs surface and then subsequent formation of the EuS ex-situ, i.e. outside the chamber in which the InAs was formed, exposing it to air and thus causing oxidation of the. These techniques will result in there still being some imperfections at the interface between the InAs and EuS.

Figure 7:
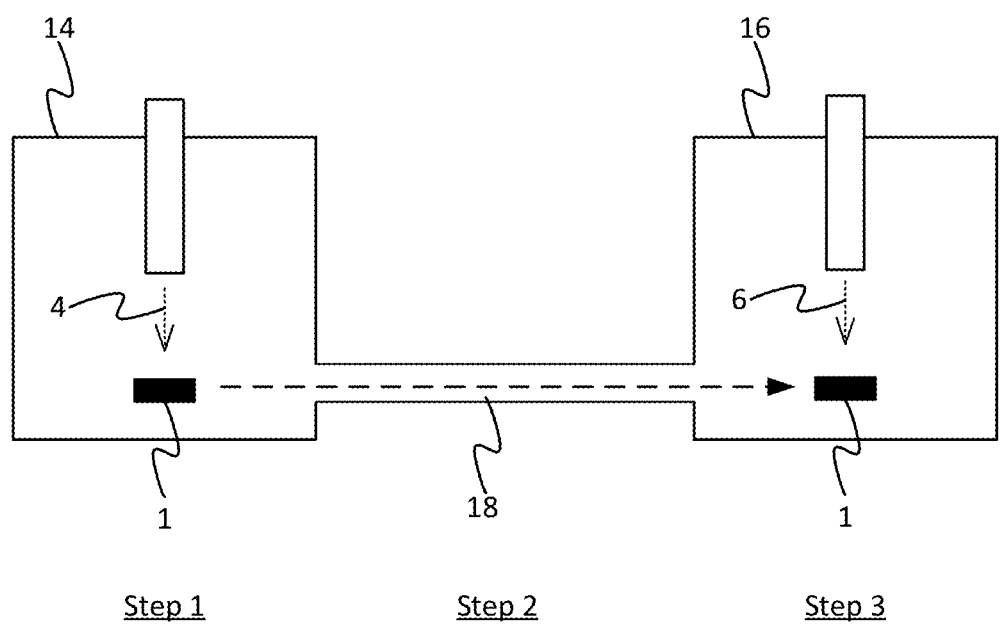

To address this, as shown in FIG. 7, it is disclosed herein to deposit the InAs by epitaxy rather than etching, e.g. by molecular beam epitaxy (MBE), and furthermore to deposit the EuS in a chamber connecting with the MBE growth chamber via a channel of high vacuum. As illustrated, in a first step the wafer 1 is placed in a first vacuum deposition chamber 14 and deposited and the semiconductor 4 (in this case InAs) is deposited over the substrate 2 of the wafer 1 while inside the first chamber 14 by an epitaxial growth technique such as MBE. In a second fabrication step, the wafer 1 (now with the semiconductor deposited on it) is transferred to a second vacuum deposition chamber 16 via an evacuated tunnel 18 which maintains the vacuum between the two chambers 14, 16 while the wafer 1 is being transferred. In a third step the ferromagnetic insulator 6 (in this case EuS) is deposited on the semiconductor 4 of the wafer 1 while inside the second chamber 16 by an epitaxial growth technique such as MBE.

The above arrangement avoids the surface of the InAs being exposing to the air and thus avoids oxidization when transferring the sample 1. Further, as the EuS is deposited on the surface of InAs after InAs growth, rather than etching, then the InAs growth will bring atomic flatness on the InAs surface and avoid roughness.

Any superconductor 10, oxide layer 8 and/or other subsequent layer may subsequently be deposited in the second chamber 16 or elsewhere, e.g. in another vacuum chamber, transferred there with or without vacuum tunnel, or outside of a vacuum chamber. E.g. in embodiments, both the oxide coating and EuS deposition can be done in the same (second) chamber 16, and the Al growth can be done in either of the two chambers 14, 16.

Figure 2:
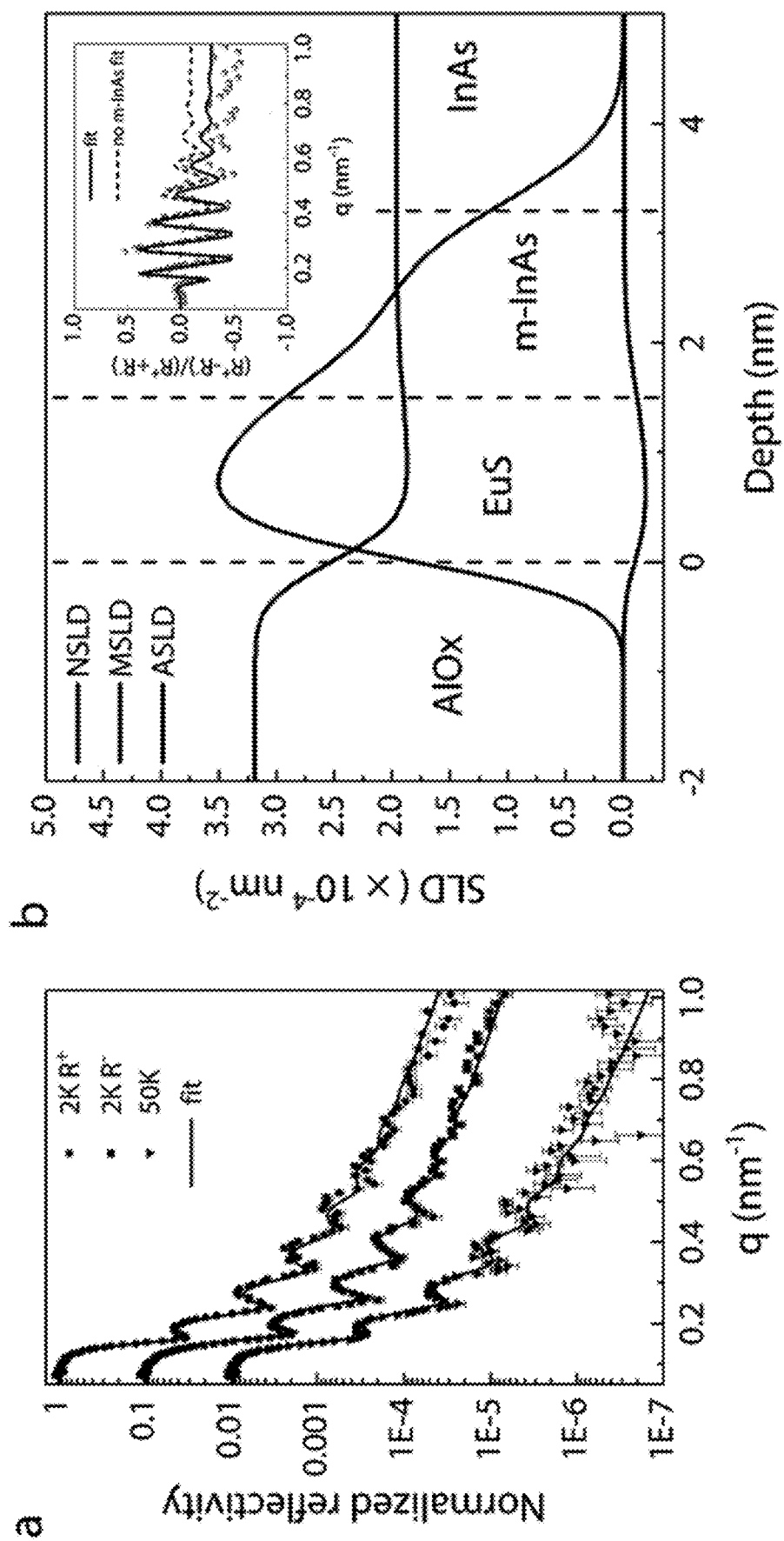
FIG. 2 illustrates polarized neutron reflectivity in InAs/EuS heterostructures.

In embodiments, the disclosed combination of EuS grown on InAs provides a hybrid material with fully coherent epitaxial matching of the semiconductor InAs and ferromagnetic insulator EuS (FIG. 1), where InAs acquires a magnetic splitting induced by proximity to EuS (FIG. 2). Moreover, the dislocation free epitaxy of EuS on InAs nanowires show strong shape-defined single-domain magnetic order along the nanowire axis can be used to provide any one or more of a number of desirable properties for large scale fabrication of quantum applications (including spintronics and topological quantum computing): it is dislocation free, allows the formation of large magnetic domains, and achieves magnetic proximity.

The epitaxial InAs/EuS system is a combination of a semiconductor and a ferromagnetic insulator in which the crystal components are lattice matched and dislocation free. This gives a promising candidate as a high performance spin-based platform. The spin states of the electrons in the semiconductor 4 (in this case InAs) can be achieved based on the magnetic field from the adjacent ferromagnetic insulator 6 (in this case EuS), meaning the need for an external global magnetic field to split the spin states can be eliminated or at least reduced (having to apply an external field is not very convenient). In operation, to achieve the splitting of the spin states may require cooling the heterostructure 3. It has been found that a temperature of 16° K or less is preferable for optimal splitting. This is the Curie temperature for the disclosed heterostructure. In embodiments the device may be cooled to below the Curie temperature, e.g. as low as 2° K.

The disclosed heterostructure of InAs with EuS can be used, for example, to provide a tuneable device allowing for tuning of the spin polarized currents which have separate spin-up and spin-down components, i.e. tuning the relative magnitude of the two current components. This or other effects could be used in implementing spin-based transistors, spin-based qubits, spin-based sensing elements or spin-based data storage.

In a spin transistor, the EuS will be disposed at the position of a gate on the InAs. A sensing element has a structure like that of the spin transistor. A storage element can be also referred to a magnetoresistance device, where EuS layers are ferromagnetic and InAs layers are nonmagnetic.

The fact that the discussed combination of InAs and EuS is dislocation free enables this to be realized in a particularly effective manner. It provides for electron transport through the crystal, which is beneficial for spin-based electronics and for quantum information technologies in general. If there are a lot of dislocations, information is lost as the quantum states react with these irregularities. For best information storage or transport, it is desirable to have as little disorder as possible.

Any one or more of the above benefits mean the disclosed combination of InAs and EuS can also find an application in topological quantum computing or other quantum information technologies.

For instance, a widely used example for realizing a topological superconducting material (relevant for topological quantum computing), are epitaxial InAs/Al nanowire structures under an applied magnetic field. It would be desirable to realize a topological state without an external magnetic field. According to another aspect disclosed herein, this may be achieved using a ferromagnetic insulator such as EuS, either as a tunnel barrier or just proximity coupling, by integrating the ferromagnetic insulator 6 into the nanowire structure to form a nanowire comprising a combination of superconductor 10, semiconductor 4 and ferromagnetic insulator 6, e.g. Al—InAs—EuS. See FIGS. 5a to 5c. Examples for implementations can include: Planar 2-dimensional quantum wells, selective area grown nanowires, and VLS grown nanowires where flexibility of designing facet growth combinations are largest.

Note: in embodiments, a nanowire structure incorporating a ferromagnetic insulator 6 may be formed from other materials for any of the superconductor 10, semiconductor 4 and ferromagnetic insulator 6. Examples of other suitable superconductor 10 include for example niobium, titanium nitride, or any other s-wave superconductor. Examples of other suitable semiconductors 4 include indium antimonide (InSb), or any other semiconductor with relatively large spin orbit and G-factor. Further, the semiconductor 4 may for example be a confined 2DEG (two-dimensional electron gas) semiconductor or a single material semiconductor.

FIG. 1 shows the coherent cubic on cubic epitaxy of EuS on InAs. FIG. 1a shows a high angle dark field (HAADF) scanning transmission electron microscope (STEM) micrograph showing a cross-sectional view on a planar epitaxial InAs//EuS film. The white box shows the zoom-in region shown in FIG. 1b. The simulated model of the suggested atomic positions near the interface are based on the mass-dependent intensity in the HAADF-STEM using the bulk component intensities as referenced in. FIGS. 1c and d show the GPA (geometric phase analysis) dilation map along the out of plane [001] direction shows a single interface layer with nearly 10% compression, while the in plane [1-10] dilation shows the epitaxial match are fully coherent and dislocation free. FIGS. 1e and f show a HAADF-STEM cross-sectional micrograph of a SAG InAs—EuS nanowire. The epitaxy is aligned in a fully coherent manner. FIG. 4 illustrates the crystal structure schematically.

FIG. 2 shows the polarized neutron reflectivity in InAs/EuS hybrid structures. FIG. 2a shows a measured and fitted ratio between the incoming and the reflected intensity R as a function of scattering vector q at 50K, and the ratio with spin parallel/antiparallel to magnetic fields, $R^+$ or $R^-$, as a function of scattering vector q at 2K. FIG. 2b shows depth profiles of PNR nuclear (NSLD), magnetic (MSLD) and absorption (ASLD) scattering length density extracted from 2K $R^+/R^-$ and 50K R. The interface between EuS and AlOx is set to zero. The inset shows PNR spin-asymmetry ratio $(R^+-R^-)/R^++R^-)$ calculated using R+ or R− obtained in a. The fit without magnetization in In As close to EuS has a large deviation from the experimental data. The error bars represent standard deviations.

Figure 5:
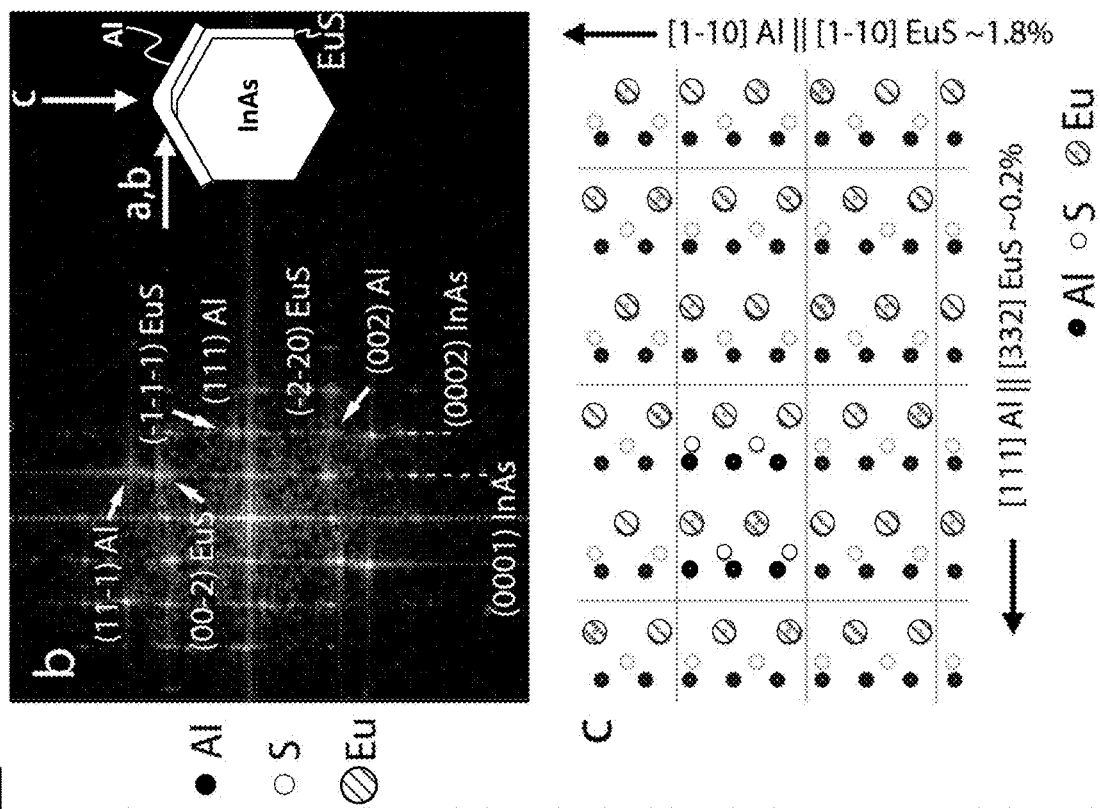
FIG. 5 illustrates atomic positions of InAs/EuS/Al tri-crystals.
Figure 5:
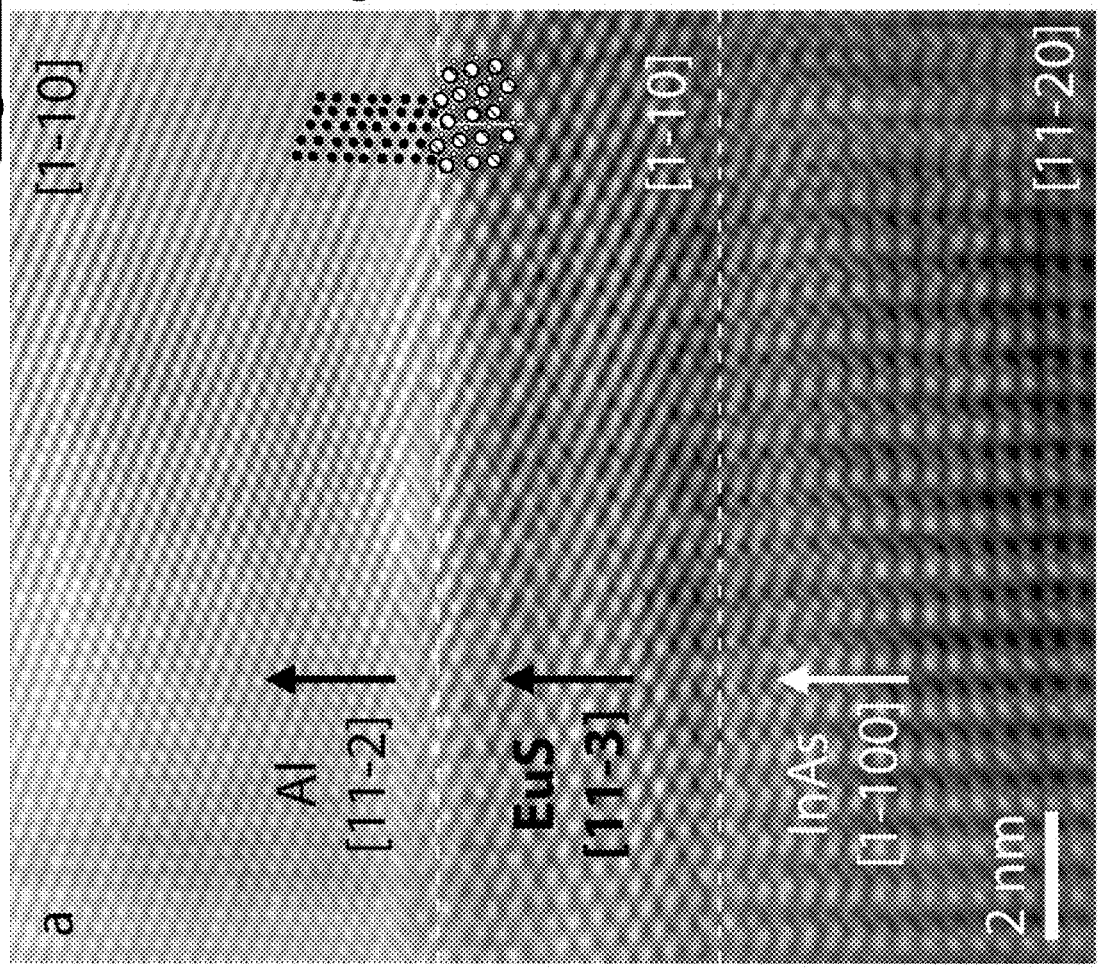
Figure 6:
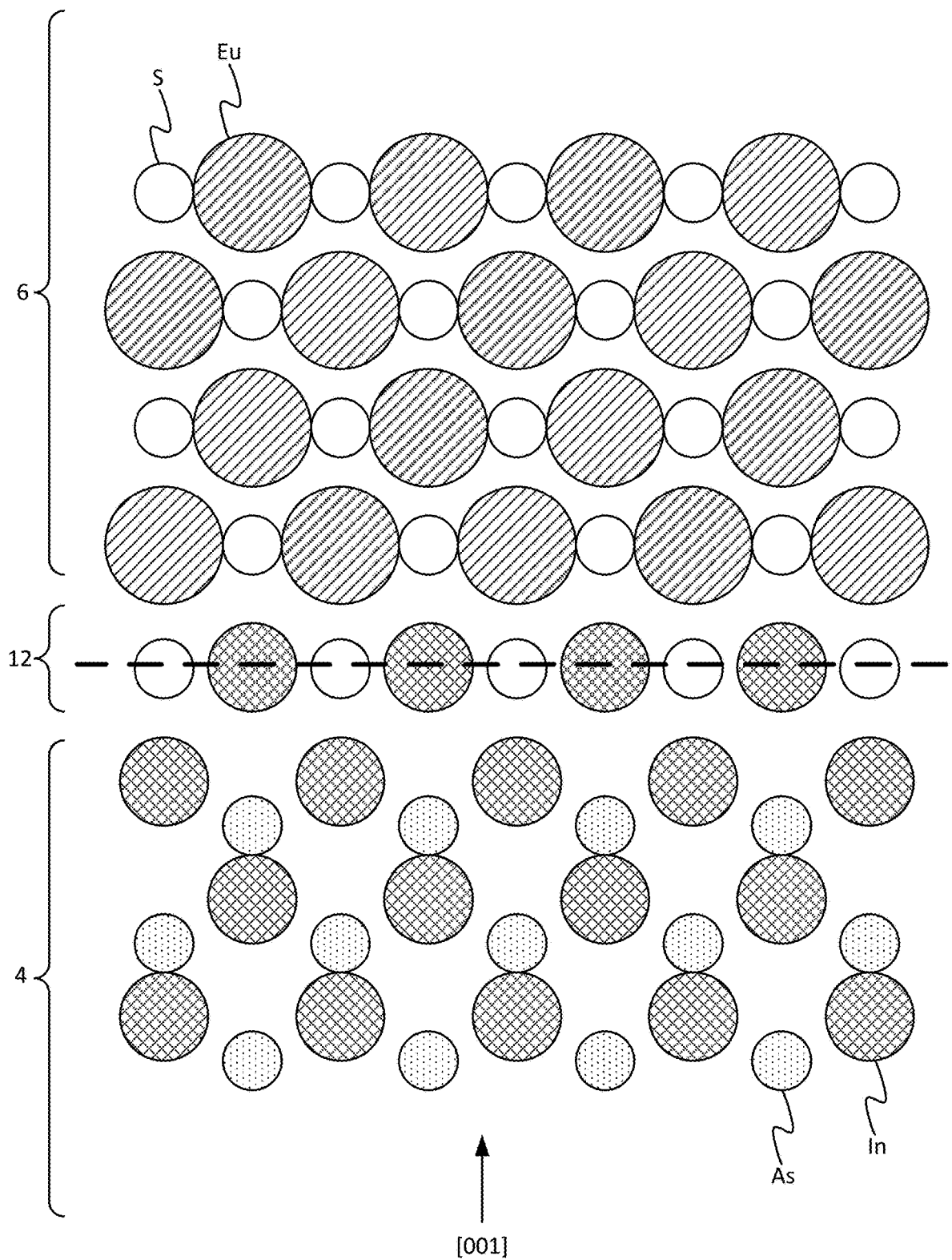
FIG. 6 schematically illustrates the structure of EuS on InAs with In—S at the interface, and FIG. 7 schematically illustrates some equipment for fabricating a heterostructure.

FIG. 5 shows the atomic positions of InAs/EuS/Al tri-crystals. FIG. 5a shows a HRTEM image of InAs/EuS/Al obtained with zone axis transverse to the {1-100}-type corner facet of the InAs/EuS/Al NW, as indicated in the upper right schematic. The crystal directions of InAs and EuS are marked with arrows. In conventional notation, { } refers a family of crystallographic planes, ( ) a crystallographic plane, < > a family of crystallographic directions, and [ ] a crystallographic direction. FIG. 5b shows the indexed power spectrum to demonstrate the coherence of lattice between InAs and EuS as well as between EuS and Al along [0001] InAs based on the HRTEM image in a (in hexagonal crystal structures, four-index notations [hklm] are used, though here I is not independent). FIG. 1c shows a top view of the interfacial atomic positions, (11-2) Al vs. (11-3) EuS, to show lattice match, using the lattice constants taken from face-centered cubic Al and RS EuS. Grey lines indicate primitive domains. Vectors show the parallel and transverse directions including the corresponding residual mismatch. All view orientations are indicated by the upper right schematic. The interface between the InAs and EuS may also have a layer of InS as shown in FIG. 6.

Any of the devices disclosed above are not necessarily limited to the particular combination of InAs as the semiconductor and EuS as the ferromagnetic insulator. More generally, the semiconductor could be but is not be limited to InAs, GaSb or InSb, including any kind of combination of these (e.g. $Ga_xIn_{1-x}As_ySb_{1-y}$), with or without any kind of doping (e.g. Bi, Te), of either single component or multi-component (e.g. multi-layer), in form of either nanoparticles, nanowires, films or bulk crystals. The ferromagnetic insulator could be but is not be limited as EuS or EuO (the two of which have similar crystal structures as one another), $Y_3Fe_5O_{12}$ or $Bi_3Fe_5O_{12}$ (the two which have similar crystal structures as one another), $YFeO_3$, $Fe_2O_3$, $Fe_3O_4$, GdN, $Sr_2CrReO_6$, $CrBr_3$ or $CrI_3$ (the two which have similar crystal structures as one another), $YTiO_3$ or diluted magnetic semiconductors (e.g. $Ga_xMn_{1-x}As$); including any kind of combination of these (e.g. $EuS_xO_{1-x}$ or $CrBi_xI_{3-x}$), with or without any kind of doping (e.g. Co, Ni, Cr, Mn).

It will be appreciated that the above embodiments have been described by way of example only. Other variants or use cases of the disclosed techniques may become apparent to the person skilled in the art once given the disclosure herein. The scope of the disclosure is not limited by the described embodiments but only by the accompanying claims.

The invention claimed is:

1. A topological quantum computing device comprising:
a network of semiconductor-superconductor nanowires, each nanowire comprising a length of semiconductor formed over a substrate and a coating of superconductor formed over and physically contacting at least part of the semiconductor,
wherein at least some of said nanowires further comprise a coating of ferromagnetic insulator disposed over at least part of the semiconductor.

2. The topological quantum computing device of claim 1, wherein at least some of the ferromagnetic insulator is formed on at least part of the semiconductor.

3. The topological quantum computing device of claim 2, wherein the semiconductor comprises InAs and the ferromagnetic insulator comprises EuS.

4. The topological quantum computing device of claim 3, wherein at least some of the coating of ferromagnetic insulator is disposed between the semiconductor and the superconductor, with at least some of the superconductor being formed on at least part of the ferromagnetic insulator; and wherein the superconductor comprises Al.

5. The topological quantum computing device of claim 1, wherein at least some of the coating of ferromagnetic insulator is disposed between the semiconductor and the superconductor, with at least some of the superconductor being formed on at least part of the ferromagnetic insulator.

6. The topological quantum computing device of claim 5, wherein the ferromagnetic insulator comprises EuS and the superconductor comprises Al.

7. The topological quantum computing device of claim 1, wherein the semiconductor comprises InAs, GaSb or InSb or a combination thereof.

8. The topological quantum computing device of claim 1, wherein the ferromagnetic insulator comprises EuS, EuO, Y3Fe5O12, Bi3Fe5O12, YFeO3, Fe2O3, Fe3O4, GdN, Sr2CrReO6, CrBr3, CrI3, YTiO3 or a diluted magnetic semiconductor, or a combination thereof.

9. The topological quantum computing device of claim 1, wherein the superconductor comprises Al.

* * * * *